US 6,741,480 B2

(12) United States Patent
Hartke et al.

(10) Patent No.: US 6,741,480 B2
(45) Date of Patent: May 25, 2004

(54) INTEGRATED POWER DELIVERY WITH FLEX CIRCUIT INTERCONNECTION FOR HIGH DENSITY POWER CIRCUITS FOR INTEGRATED CIRCUITS AND SYSTEMS

(75) Inventors: David H. Hartke, Lake Havasu, AZ (US); Joseph Ted DiBene, II, Oceanside, CA (US)

(73) Assignee: Incep Technologies, Inc., San Diego, CA (US)

( * ) Notice: Subject to any disclaimer, the term of this patent is extended or adjusted under 35 U.S.C. 154(b) by 41 days.

(21) Appl. No.: 10/005,024

(22) Filed: Dec. 4, 2001

(65) Prior Publication Data

US 2002/0164895 A1 Nov. 7, 2002

Related U.S. Application Data

(63) Continuation-in-part of application No. 10/022,454, filed on Oct. 30, 2001, now Pat. No. 6,556,455, and a continuation-in-part of application No. 09/921,153, filed on Aug. 2, 2001, and a continuation-in-part of application No. 09/921,152, filed on Aug. 2, 2001, and a continuation-in-part of application No. 09/910,524, filed on Jul. 20, 2001, now abandoned, which is a continuation-in-part of application No. 09/885,780, filed on Jun. 19, 2001, now abandoned, and a continuation-in-part of application No. 09/818,173, filed on Mar. 26, 2001, now abandoned, and a continuation-in-part of application No. 09/802,329, filed on Mar. 8, 2001, now Pat. No. 6,452,804, and a continuation-in-part of application No. 09/801,437, filed on Mar. 8, 2001, and a continuation-in-part of application No. 09/798,541, filed on Mar. 2, 2001, now abandoned, and a continuation-in-part of application No. 09/785,892, filed on Feb. 16, 2001, now Pat. No. 6,452,113, and a continuation-in-part of application No. 09/727,016, filed on Nov. 28, 2000, and a continuation-in-part of application No. 09/432,878, filed on Nov. 2, 1999, now Pat. No. 6,356,448, which is a continuation-in-part of application No. 09/353,428, filed on Jul. 15, 1999, now Pat. No. 6,304,450.

(60) Provisional application No. 60/251,222, filed on Dec. 4, 2000, provisional application No. 60/251,223, filed on Dec. 4, 2000, provisional application No. 60/251,184, filed on Dec. 4, 2000, provisional application No. 60/266,941, filed on Feb. 6, 2001, provisional application No. 60/277,369, filed on Mar. 19, 2001, provisional application No. 60/287,860, filed on May 1, 2001, provisional application No. 60/291,749, filed on May 16, 2001, provisional application No. 60/291,772, filed on May 16, 2001, provisional application No. 60/292,125, filed on May 18, 2001, provisional application No. 60/299,573, filed on Jun. 19, 2001, provisional application No. 60/301,753, filed on Jun. 27, 2001, provisional application No. 60/304,929, filed on Jul. 11, 2001, provisional application No. 60/304,930, filed on Jul. 11, 2001, provisional application No. 60/310,038, filed on Aug. 3, 2001, provisional application No. 60/313,338, filed on Aug. 17, 2001, provisional application No. 60/338,004, filed on Nov. 8, 2001, provisional application No. 60/167,792, filed on Nov. 29, 2001, provisional application No. 60/171,065, filed on Dec. 16, 1999, provisional application No. 60/183,474, filed on Feb. 18, 2000, provisional application No. 60/187,777, filed on Mar. 8, 2000, provisional application No. 60/196,059, filed on Apr. 10, 2000, provisional application No. 60/219,813, filed on Jul. 21, 2000, provisional application No. 60/222,386, filed on Aug. 2, 2000, provisional application No. 60/222,407, filed on Aug. 2, 2000, provisional application No. 60/232,971, filed on Sep. 14, 2000, provisional application No. 60/186,769, filed on Mar. 3, 2000, and provisional application No. 60/219,506, filed on Jul. 20, 2000.

(51) Int. Cl.[7] .......................... H05K 1/11; H05K 1/14
(52) U.S. Cl. ........................ 361/803; 361/787; 439/67
(58) Field of Search ................................ 361/775–778, 361/785–787, 803, 736, 737, 762, 763; 439/67, 65, 74, 492, 493, 637

(56) References Cited

U.S. PATENT DOCUMENTS

| | | |
|---|---|---|
| 4,498,530 A | 2/1985 | Lipschutz |
| 4,521,829 A | 6/1985 | Wessely |
| 4,589,057 A | 5/1986 | Short |
| 4,760,495 A | 7/1988 | Till |
| 4,771,365 A | 9/1988 | Cichocki et al. |
| 4,942,497 A | 7/1990 | Mine et al. |
| 4,982,311 A | 1/1991 | Dehaine et al. |
| 5,052,481 A | 10/1991 | Horvath et al. |
| 5,065,280 A | 11/1991 | Karnezos et al. |
| 5,161,089 A | 11/1992 | Chu et al. |
| 5,195,020 A | 3/1993 | Suzuki et al. |
| 5,272,599 A | 12/1993 | Koenen |
| 5,331,510 A | 7/1994 | Ouchi et al. |
| 5,343,358 A | 8/1994 | Hilbrink |

Section A-A

| | | | |
|---|---|---|---|
| 5,365,402 A | | 11/1994 | Hatada et al. |
| 5,380,211 A | | 1/1995 | Kawaguchi et al. |
| 5,390,078 A | | 2/1995 | Taylor |
| 5,396,403 A | | 3/1995 | Patel |
| 5,409,055 A | | 4/1995 | Tanaka et al. |
| 5,467,251 A | | 11/1995 | Katchmar |
| 5,473,510 A | | 12/1995 | Dozier, II |
| 5,504,924 A | | 4/1996 | Ohashi et al. |
| 5,510,958 A | | 4/1996 | Shimabara et al. |
| 5,515,912 A | | 5/1996 | Daikoku et al. |
| 5,536,178 A | * | 7/1996 | Novelli .......... 439/74 |
| 5,564,931 A | * | 10/1996 | Fabian et al. ......... 439/62 |
| 5,619,399 A | | 4/1997 | Mok |
| 5,621,615 A | | 4/1997 | Dawson et al. |
| 5,646,826 A | | 7/1997 | Katchmar |
| 5,661,902 A | | 9/1997 | Katchmar |
| 5,708,566 A | | 1/1998 | Hunninghaus et al. |
| 5,729,433 A | | 3/1998 | Mok |
| 5,734,555 A | | 3/1998 | McMahon |
| 5,735,696 A | * | 4/1998 | Niitsu et al. ......... 439/65 |
| 5,761,043 A | | 6/1998 | Salmonson |
| 5,794,454 A | | 8/1998 | Harris et al. |
| 5,796,582 A | | 8/1998 | Katchmar |
| 5,801,924 A | | 9/1998 | Salmonson |
| 5,815,921 A | | 10/1998 | Burward-Hoy |
| 5,825,633 A | | 10/1998 | Bujalski et al. |
| 5,842,514 A | | 12/1998 | Zapach et al. |
| 5,856,911 A | | 1/1999 | Riley |
| 5,864,478 A | | 1/1999 | McCutchan et al. |
| 5,898,573 A | | 4/1999 | Fugaro |
| 5,920,458 A | | 7/1999 | Azar |
| 5,930,115 A | | 7/1999 | Tracy et al. |
| 5,980,267 A | | 11/1999 | Ayers et al. |
| 5,984,704 A | * | 11/1999 | Hashiguchi ......... 439/260 |
| 5,986,887 A | | 11/1999 | Smith et al. |
| 5,995,370 A | | 11/1999 | Nakamori |
| 6,053,746 A | * | 4/2000 | Yoshizawa ......... 439/67 |
| 6,231,352 B1 | | 5/2001 | Gonzales |

FOREIGN PATENT DOCUMENTS

| | | |
|---|---|---|
| EP | 0 582 145 | 2/1994 |
| EP | 0 717 443 A1 | 6/1996 |
| EP | 0 920 055 A2 | 6/1999 |
| JP | 11-074427 | 3/1999 |
| WO | WO 96/23397 | 8/1996 |

OTHER PUBLICATIONS

Patent Abstracts of Japan, Publication No. 08204304, Publication date: Sep. 8, 1996, Application No. 07012207, Application date: Jan. 30, 1995, (1 page Abstract).

XP000124263, IBM Tech Disc Bulletin, "Multiple Electronic Board . . . System," 33(3B):55–56.

Patent Abstracts of Japan, 1997, vol. 4 & JP 08 330699, Dec. 13, 1996.

Int'l Search Report of PCT/US00/29452.

* cited by examiner

*Primary Examiner*—Kamand Cuneo
*Assistant Examiner*—Tuan Dinh
(74) *Attorney, Agent, or Firm*—Knobbe Martens Olson & Bear LLP

(57) ABSTRACT

A method and apparatus for electrically interconnecting a first circuit board having a power conditioning circuit and a second circuit board having a power dissipating component disposed therebelow along a z (vertical) axis is disclosed. In an illustrative embodiment, the apparatus comprises a first flexible circuit having a first set of raised conductive contacts, the first flexible circuit disposed on a first side of the second circuit board; and a second flexible circuit having a second set of raised conductive contacts, the second flexible circuit disposed on a second side of the second circuit board opposing the first side of the second circuit board. A power signal from the power conditioning circuit is provided to the second circuit board at least in part by one of the first set of raised conductive contacts on the flexible circuit and the second set of raised conductive contacts on the second flexible circuit and a ground return is provided to the second circuit board by the other of the first set of raised conductive contacts on the first flexible circuit and the second set of raised conductive contacts on the second flexible circuit.

17 Claims, 9 Drawing Sheets

Section A-A

Section B-B

Section A-A

Section B-B

Section A-A

Section A-A

INTEGRATED POWER DELIVERY WITH FLEX CIRCUIT INTERCONNECTION FOR HIGH DENSITY POWER CIRCUITS FOR INTEGRATED CIRCUITS AND SYSTEMS

CROSS-REFERENCE TO RELATED APPLICATIONS

This application claims benefit of the following provisional patent applications, which are hereby incorporated by reference herein.

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, Farhad Raiszadeh, filed May 18, 2001;

Application Serial No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO-I-PAK," by Joseph T. DiBene II, Carl E. Hoge, David H. Hartke, and Edward J. Derian, filed Jul. 11, 2001;

Application Serial No. 60/310,038, entitled "TOOL-LESS CONCEPTS FOR BORREGO," by Edward J. Derian and Joseph T. DiBene II, filed Aug. 3, 2001;

Application Serial No. 60/313,338, entitled "TOOL-LESS PRISM IPA ASSEMBLY TO SUPPORT IA64 MCKINLEY MICROPROCESSOR," by David H. Hartke and Edward J. Derian, filed Aug. 17, 2001; and Application Ser. No. 60/338,004, entitled "MICRO-SPRING CONFIGURATIONS FOR POWER DELIVERY FROM VOLTAGE REGULATOR MODULES TO INTEGRATED CIRCUITS AND MICROPROCESSORS," by Joseph T. DiBene II, David H. Hartke, Carl E. Hoge, and Edward J. Derian, filed Nov. 8, 2001.

This patent application is also continuation-in-part of the following co-pending and commonly assigned patent applications, each of which applications are hereby incorporated by reference herein:

Application Ser. No. 09/885,780, entitled "INTER-CIRCUIT ENCAPSULATED PACKAGING," by Joseph T. DiBene II and David H. Hartke, filed Jun. 19, 2001, now abandoned which is a continuation of application Ser. No. 09/353,428, entitled "INTER-CIRCUIT ENCAPSULATED PACKAGING," by Joseph T. DiBene II and David H. Hartke, filed Jul. 15, 1999 and now issued as U.S. Pat. No. 6,304,450;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999, now U.S. Pat. No. 6,356,448;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000, which claims priority to the following U.S. Provisional Patent Applications:

Application Serial No. 60/167,792, entitled "EMI CONTAINMENT USING INTER-CIRCUIT ENCAPSULATED PACKAGING TECHNOLOGY," by Joseph T. DiBene II and David H. Hartke, filed Nov. 29, 1999;

Application Serial No. 60/171,065, entitled "INTER-CIRCUIT ENCAPSULATION PACKAGING TECHNOLOGY," by Joseph T. DiBene II and David H. Hartke, filed Dec. 16, 1999;

Application Serial No. 60/183,474, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 18, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled 'HIGH CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000; and Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000, Application Ser. No. 09/785,892, entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001 which claims priority to the following U.S. Provisional Patent Applications:

Application Serial No. 60/183,474, entitled "METHOD AND APPARATUS FOR PROVIDING POWER TO A MICROPROCESSOR WITH INTEGRATED THERMAL AND EMI MANAGEMENT, by Joseph T. DiBene II and David H. Hartke, filed Feb. 18, 2000;

Application Serial No. 60/186,769, entitled "THERMACEP SPRING BEAM," by Joseph T. DiBene II and David H. Hartke, filed Mar. 3, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled 'EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled 'HIGH CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY HIGH POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," By Joseph T. DiBene II, David H. Hartke, Carl E. Hoge, James M. Broder, and Joseph S. Riel, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001, Application Ser. No. 09/798,541, entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001, now abandoned which claims priority to the following U.S. Provisional Patent Applications:

Application Serial No. 06/185,769, entitled "THERMACEP SPRING BEAM," by Joseph T. DiBene II and David H. Hartke, filed Mar. 3, 2000;

Application Serial No. 60/183,474, entitled "METHOD AND APPARATUS FOR PROVIDING POWER TO A MICROPROCESSOR WITH INTEGRATED THERMAL AND EMI MANAGEMENT," by Joseph T. DiBene II and David H. Hartke, filed Feb. 18, 2000;

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by David H. Hartke, James M. Broder, and Joseph T. DiBene II, filed Feb. 6, 2001, Application Ser. No. 09/801,437, entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed Mar. 8, 2001, which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT, by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001, Application Ser. No. 09/802,329, entitled "METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE" by Joseph T. DiBene II and David H. Hartke, filed Mar. 8, 2001, now U.S. Pat. No. 6,452,804 which claims priority to the following U.S. Provisional Patent Applications:

Application Serial No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Serial No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT, by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000; and Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001, Application Ser. No. 09/910,524, entitled "HIGH PERFORMANCE THERMAL/MECHANICAL INTERFACE FOR FIXED-GAP REFERENCES FOR HIGH HEAT FLUX AND POWER SEMICONDUCTOR APPLICATIONS", by Joseph T. DiBene, II, David H. Hartke, Wendell C. Johnson, Farhad Raiszadeh, Edward J. Darien and Jose B. San Andres, filed Jul. 20, 2001, now abandoned which claims priority to the following U.S. Provisional Patent Applications:

Application Serial No. 60/219,506, entitled "HIGH PERFORMANCE THERMAL/MECHANICAL INTERFACE," by Joseph T. DiBene II, David H. Hartke, and Wendell C. Johnson, filed Jul. 20, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene Ii and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

Application Serial No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001; and Application Serial No. 60/304,930, entitled "MICRO-I-PAK, by Joseph T. DiBene II, Carl E. Hoge, David H. Hartke, and Edward J. Derian, filed Jul. 11, 2001, Application Ser. No. 09/921,153 entitled "VAPOR CHAMBER WITH INTEGRATED PIN ARRAY", by Joseph T. DiBene, II and Farhad Raiszadeh, filed on Aug. 2, 2001 which claims priority to the following U.S. Provisional Patent Applications:

Application Serial No., 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

Application Serial No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001; and Application Serial No. 60/304,930, entitled "MICRO-I-PAK, by Joseph T. DiBene II, Carl E. Hoge, David H. Hartke, and Edward J. Derian, filed Jul. 11, 2001, Application Ser. No. 09/818,173, entitled "INTERCIRCUIT ENCAPSULATED PACKAGING," by David H. Hartke and Joseph T. DiBene II, filed Mar. 26, 2001, now abandoned which claims priority to the following U.S. Provisional Patent Applications:

Application Serial No. 60/196,059, entitled "THERMAL INTERFACE MATERIAL IN AN AGGREGATE DIAMOND MIXTURE," by Joseph T. DiBene II and David H. Hartke, filed Apr. 10, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

Application Serial No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001; and Application Serial No. 60/304,930, entitled "MICRO-I-PAK, by Joseph T. DiBene II, Carl E. Hoge, David H. Hartke, and Edward J. Derian, filed Jul. 11, 2001, Application Ser. No. 09/921,152, entitled "HIGH SPEED AND DENSITY CIRCULAR CONNECTOR FOR BOARD-TO-BOARD INTERCONNECTION SYSTEMS," by David H. Hartke and Joseph T. DiBene II, filed on Aug. 2, 2001;

Application Serial No., 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

Application Serial No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001; and Application Serial No. 60/304,930, entitled "MICRO-I-PAK, by Joseph T. DiBene II, Carl E. Hoge, David H. Hartke, and Edward J. Derian, filed Jul. 11, 2001, Application Ser. No. 09/921,153, entitled "VAPOR CHAMBER WITH INTEGRATED PIN ARRAY," by Joseph T. DiBene II, and Farhad Raiszadeh, filed Aug. 2, 2001, which claims priority to the following U.S. Provisional Patent Applications:

Application Serial No. 60/222,386, entitled "HIGH DENSITY CIRCULAR 'PIN' CONNECTOR FOR HIGH SPEED SIGNAL INTERCONNECT," by David H. Hartke and Joseph T. DiBene II, filed Aug. 2, 2000;

Application Serial No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Serial No. 60/219,813, entitled "HIGH CURRENT MICROPROCESSOR POWER DELIVERY SYSTEMS," by Joseph T. DiBene II, filed Jul. 21, 2000;

Application Serial No. 60/232,971, entitled "INTEGRATED POWER DISTRIBUTION AND SEMICONDUCTOR PACKAGE," by Joseph T. DiBene II and James J. Hjerpe, filed Sep. 14, 2000;

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE" by David H. Hartke, James M. Broder and Joseph T. DiBene II, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, Filed May 18, 2001;

Application Serial No. 60/299,573, entitled "IMPROVED MICRO-I-PAK STACK-UP ARCHITECTURE," by Joseph T. DiBene II, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001; and Application Serial No. 60/304,930, entitled "MICRO-I-PAK, by Joseph T. DiBene II, Carl E. Hoge, David H. Hartke, and Edward J. Derian, filed Jul. 11, 2001, and Application Ser. No. 10/022,454, entitled "ULTRA-LOW IMPEDANCE POWER INTERCONNECTION SYSTEM FOR ELECTRONIC PACKAGING," by Joseph T. DiBene II, David H. Hartke, Carl E. Hoge, and Edward J. Derian, filed Oct. 30, 2001, now U.S. Pat. No. 6,556,455 which application claims priority to the following U.S. Provisional Applications:

Application Serial No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Serial No. 60/251,223, entitled "MICRO-I-PAK FOR POWER DELIVERY TO MICROELECTRONICS," by Joseph T. DiBene II and Carl E. Hoge, filed Dec. 4, 2000;

Application Serial No. 60/251,184, entitled "MICROPROCESSOR INTEGRATED PACKAGING," by Joseph T. DiBene II, filed Dec. 4, 2000;

Application Serial No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURE," by Joseph T. DiBene II, David H. Hartke, and James M. Broder, filed Feb. 6, 2001;

Application Serial No. 60/277,369, entitled "THERMAL-MECHANICAL MEASUREMENT AND ANALYSIS OF ADVANCED THERMAL INTERFACE MATERIAL CONSTRUCTION," by Joseph T. DiBene II, David H. Hartke and Farhad Raiszadeh, filed Mar. 19, 2001;

Application Serial No. 60/287,860, entitled "POWER TRANSMISSION DEVICE," by Joseph T. DiBene II, David H. Hartke, Carl E. Hoge, and Edward J. Derian, filed May 1, 2001;

Application Serial No. 60/291,749, entitled "MICRO I-PAK ARCHITECTURE HAVING A FLEXIBLE CONNECTOR BETWEEN A VOLTAGE REGULATION MODULE AND SUBSTRATE," by Joseph T. DiBene II, filed May 16, 2001;

Application Serial No. 60/291,772, entitled "I-PAK ARCHITECTURE POWERING MULTIPLE DEVICES," by Joseph T. DiBene II, David H. Hartke, Carl E. Hoge, and Edward J. Derian, filed May 16, 2001;

Application Serial No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II, Farhad Raiszadeh, filed May 18, 2001;

Application Serial No. 60/299,573, entitled "IMPROVED MICRO-I-PAK STACK-UP ARCHITECTURE," by Joseph T. DiBene, Carl E. Hoge, and David H. Hartke, filed Jun. 19, 2001;

Application Serial No. 60/301,753, entitled "INTEGRATED POWER DELIVERY USING HIGH PERFORMANCE LINEAR REGULATORS ON PACKAGE WITH A MICROPROCESSOR," by Joseph T. DiBene II, Carl E. Hoge, and David H. Hartke, filed Jun. 27, 2001;

Application Serial No. 60/304,929, entitled "BORREGO ARCHITECTURE," by David H. Hartke and Joseph T. DiBene II, filed Jul. 11, 2001;

Application Serial No. 60/304,930, entitled "MICRO-I-PAK," by Joseph T. DiBene II, Carl E. Hoge, David H. Hartke, and Edward J. Derian, filed Jul. 11, 2001;

Application Serial No. 60/310,038, entitled "TOOLLESS CONCEPTS FOR BORREGO," by Edward J. Derian and Joseph T. DiBene II, filed Aug. 3, 2001; and Application Serial No. 60/313,338, entitled "TOOLLESS PRISM IPA ASSEMBLY TO SUPPORT IA64 MCKINLEY MICROPROCESSOR," by David H. Hartke and Edward J. Derian, filed Aug. 17, 2001.

BACKGROUND OF THE INVENTION

1. Field of the Invention

The present invention relates to systems and methods for electrically interconnecting circuit boards, and in particular to a system and method for transmitting high power through a flexible circuit interconnect from the edge of a printed circuit board, through multiple coaxial interconnects, to a power regulator board, all within a reduced form factor.

2. Description of the Related Art

As processing speeds continue to increase, the power demands of the processors used in such systems (such as microprocessors for servers and desktop systems) have increased dramatically. While patent applications referenced above have shown that it is desirable to mount power conversion modules (which convert higher voltage signals to low voltage-high current power signals) close to the devices that have high power dissipation requirements, it is often difficult to do so due to thermal, mechanical and other constraints.

One reason for this difficulty is that the power in such devices often requires large heatsinks which encroach on the power conversion modules and forces the power conversion to be further away then desired. Thus, what often results is a fairly high dynamic voltage drop across the interconnection of the power interconnect, due to high slew-rate switching of the load, typically resulting in false switching of the device itself which may corrupt data. Therefore, it is seen that there is a need to bring both the power regulation closer to the load while maintaining a low impedance, small form factor, and easy to assemble construction which is of reasonably low cost. The present invention satisfies that need.

SUMMARY OF THE INVENTION

To address the requirements described above, the present invention discloses a method and apparatus for electrically interconnecting a first circuit board having a power conditioning circuit and a second circuit board having a power dissipating component disposed therebelow along a z (vertical) axis. In an illustrative embodiment, the apparatus comprises a first flexible circuit having a first set of raised conductive contacts, the first flexible circuit disposed on a first side of the second circuit board; and a second flexible circuit having a second set of raised conductive contacts, the second flexible circuit disposed on a second side of the second circuit board opposing the first side of the second circuit board. A power signal from the power conditioning circuit is provided to the second circuit board at least in part by either the first set of raised conductive contacts on the first flexible circuit or the second set of raised conductive contacts on the second flexible circuit. Further, a ground return is provided to the second circuit board by the set of raised conductive contacts that are not used to provide the power signal from the power conditioning circuit to the second circuit board.

The present invention therefore can be described by a power interconnecting structure between a power regulator board and the card edge connector of an interposer board which houses a high performance microprocessor using a low impedance, low cost, flexible circuit. The housing may be made of molded plastic and the flexible circuits may be single-sided. The flexible circuit has multiple coaxial interconnects which interconnect to a power regulator module mounted directly above the edge-card interface of the interposer or the flexible circuit can connect directly to the power module without the intervention of the coaxial interconnects. A substrate may be mounted between or on the flexible circuits for interconnect to the coaxial connectors or the connection may be made directly to the flexible circuits themselves. The coaxial interconnects can be disconnectable at the flexible circuit side or the power module interface or may be permanently attached to both sides. Pressure to the edge card contact region on the interposer is maintained through either an elastomeric pad residing within the housing or through spring fingers located in the same area as the elastomer which maintains a constant force for a high conductivity electrical connection by pressing against the back of the flexible circuit opposite the side the bumps are located. Low electrical impedance is maintained by keeping the separation between the flexible circuits very small throughout the design. The electrical connection between the power regulator module and interposer requires very little space and maintains a very low electrical impedance while compacting the overall construction by placing the integrated power regulator module above the interposer itself. The unit also is designed where the flexible circuits compensate for mechanical tolerances in the stackup relieving forces from being applied to the interposer and its associated thermal interface.

DETAILED DESCRIPTION OF PREFERRED EMBODIMENTS

Figure 1A:
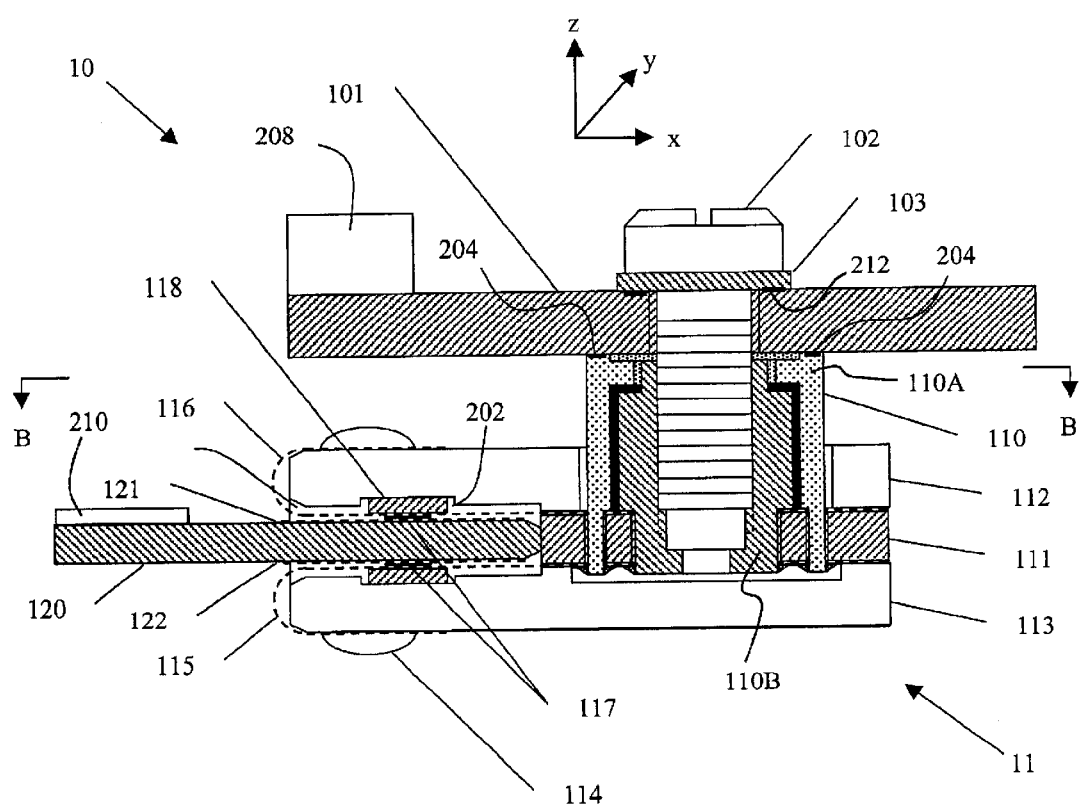
FIG. 1A is a diagram illustrating a section view of the power interconnecting structure wherein the flexible circuit is split into separate circuits using a rigid circuit board which connect to the card edge connection pads of an interposer and, through coaxial interconnects attached to the rigid circuit board, join to a power regulator module.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Arbitrarily, pad 121 is generally assigned ground potential and pad 122 is assigned power. A first (upper) flexible circuit 116 is provided with either a continuous raised strip or a set of individual raised bump contacts 117 which electrically engage with the pad 121 on interposer 120. The strip 117 or individual contact bumps can be formed as a part of the flexible circuit 116 using either electro-plating methods or formed and solder joined contracts as currently practiced in the industry. In a similar manner, a lower flexible circuit 115 is also provided with a continuous raised strip 115 or individual contact bumps. In the illustrated embodiment, each flexible circuit 116, 117 carries only one polarity of power e.g., ground and power.

Pressure is applied to the contact area (the junction between ground around pad 121 and strip/contact 117)

utilizing compressible members 118 such as elastomeric pads residing in a cavity 202 formed by the upper housing 112 and the lower housing 113. Although shown as an elastomeric pad it is also possible to utilize a spring finger strip which can be located in the same area as the elastomeric pad 118 to provide a uniform pressure to the contact area. Upper flexible circuit 116 and lower flexible circuit 115 are joined to rigid circuit board 111 which provides a mounting structure for coaxial interconnects 110 and serves as a limit stop when inserting power interface assembly 11 into processor interposer 120.

Pressure is applied to the contact area (the junction between interposer pad 121 and strip/contact 117) utilizing compressible members 118 such as elastomeric pads residing in a cavity 202 formed by the upper housing 112 and the lower housing 113. Although shown as an elastomeric pad it is also possible to utilize a spring finger strip which can be located in the same area as the elastomeric pad 118 to provide a uniform pressure to the contact area. Upper flexible circuit 116 and lower flexible circuit 115 are In the illustrated embodiment, one or more coaxial interconnects 110 are permanently attached to circuit board 111 and a separable connection is provided at power regulator module 101 utilizing screw 102 and washer 103 which provide a high pressure contact between the outer cylinder 110A of the coaxial interconnect 110 and ground pads 204 on power regulator module 101. The power conditioning circuitry 208 is then electrically connected to the ground pads 204 by a combination of vias and/or conductive planes and/or traces in the first circuit board 101.

Similarly, the power circuit through the center conductor 110B of coaxial connector 110 is passed through the screw 102 and washer 103 to power polarity pads 212 on the top of the first circuit board 101. The power conditioning circuitry 208 is then electrically connected to the power pads 212 by a combination of vias and/or conductive planes and/or traces in the first circuit board 101.

It should be noted that other designs of coaxial interconnect are possible and are disclosed in patents referenced above and hereby incorporated by reference herein.

The ends of flexible circuits 116, 115 are wrapped around the ends of the first housing 112 and the second housing 113 and are secured in place using attachment 114 which can preferably take the form of a heat stake if housings 112, 113 are plastic or may utilize riveting methods if housings 112, 113 are formed of metal. Fasteners 123 secure the upper housing 112 to the lower housing 113 while "trapping in place" rigid circuit board 111, thus creating a single assembly 11 in which the second circuit board 120 can be inserted and which can be secured to the first circuit board 101 using disconnectable fasteners, such as the screw 102 and washer 103.

Although the mechanical tolerances of the stackup between the first circuit board 101 and the second circuit board 120 in the z-axis (vertical) direction are small, such tolerances must be accounted for, thus requiring some degree of flexibility between these components. Flexible circuits 115 and 116 provide for this mechanical acceptance in the area between the contact pad 117 and the rigid board 111.

Figure 1B:
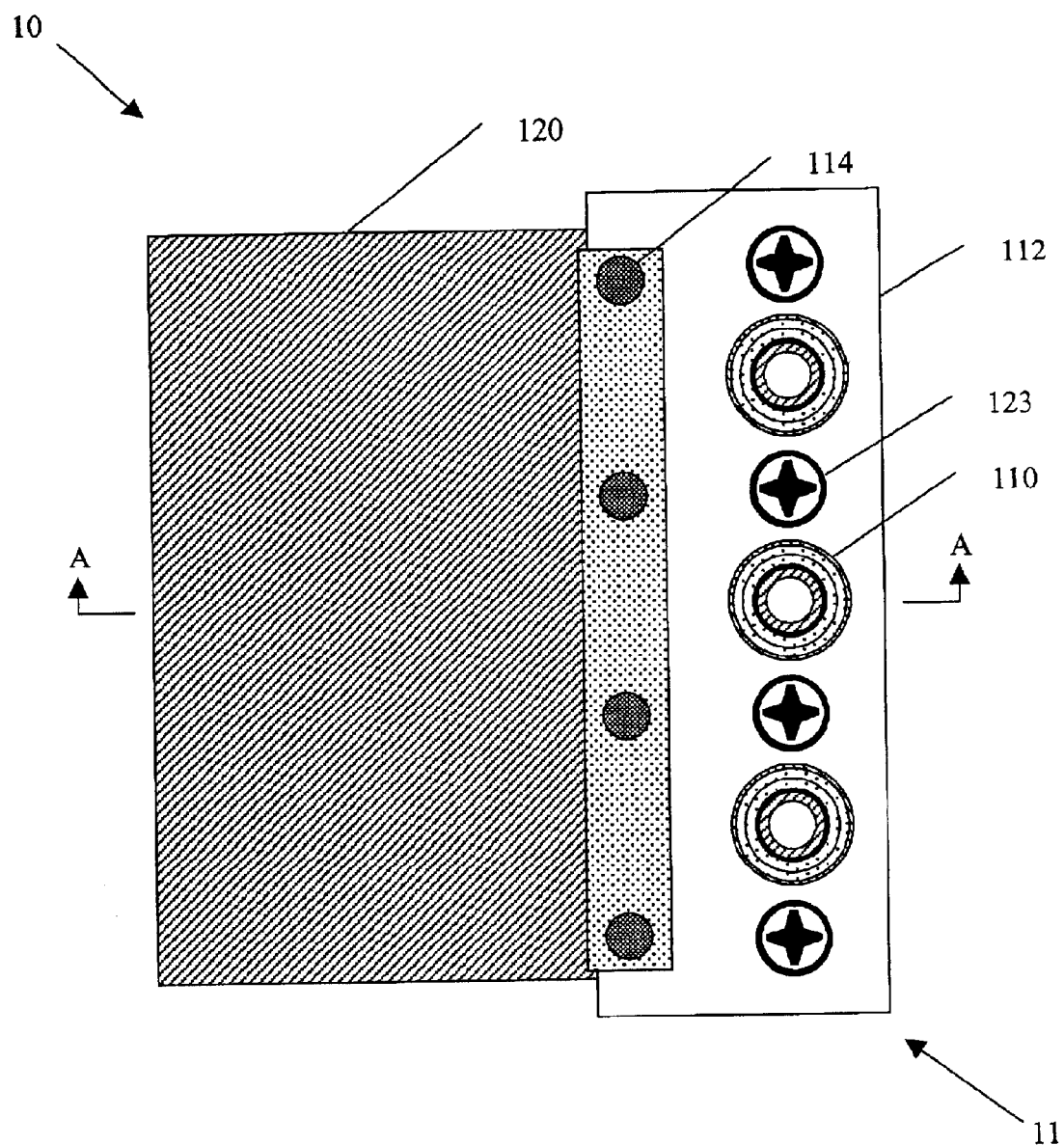
FIG. 1B is a diagram illustrating a plan section view of the embodiment in FIG. 1A.

The interconnect structure shown in FIGS. 1A and 1B provide an electrical connection between the first circuit board 101 and the second circuit board 120 having very low electrical interconnect impedance. The inductive portion of this impedance is kept low by minimizing the loop area between contact pads 117 and coaxial interconnect 110 attachment and by using the coaxial interconnects 110 which also have very low inductance.

Figure 2A:
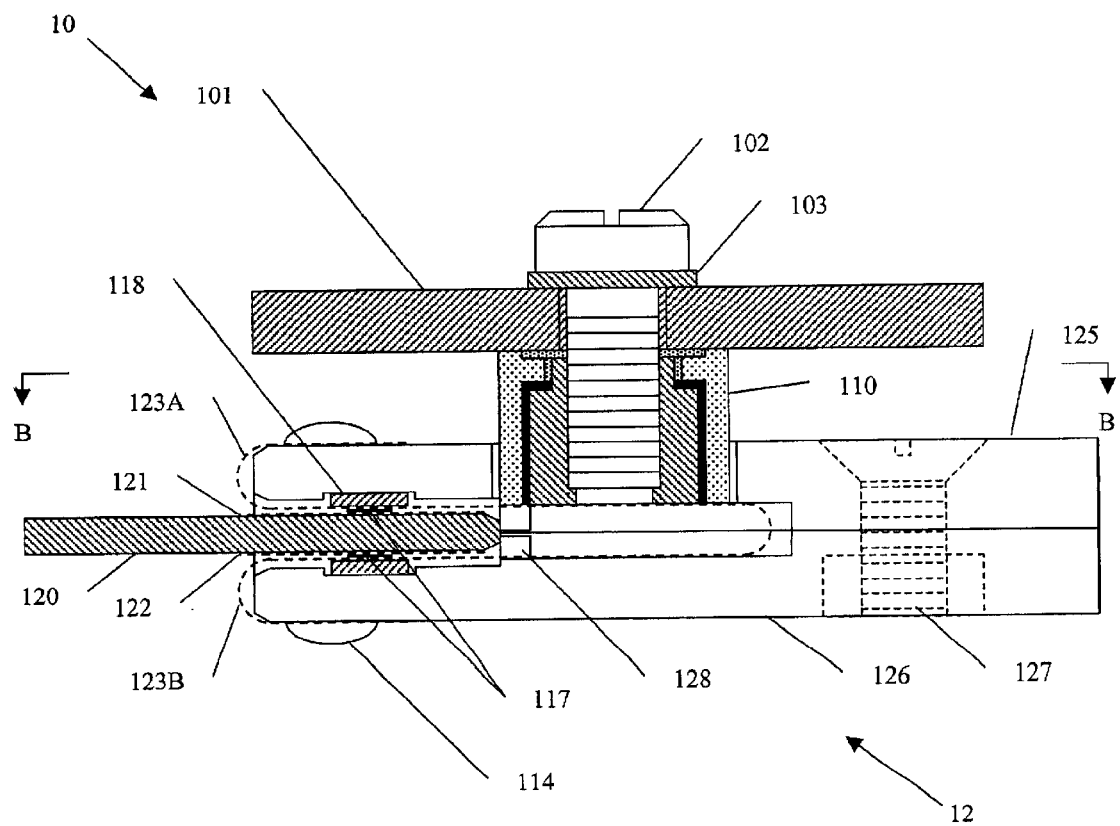
FIG. 2A is a diagram showing a section view where a single flexible circuit is used rather than two and the flexible circuit wraps around internal to the housing embracing the card edge connection pads of an interposer and, through coaxial interconnects, join to a power regulator module.
Figure 2B:
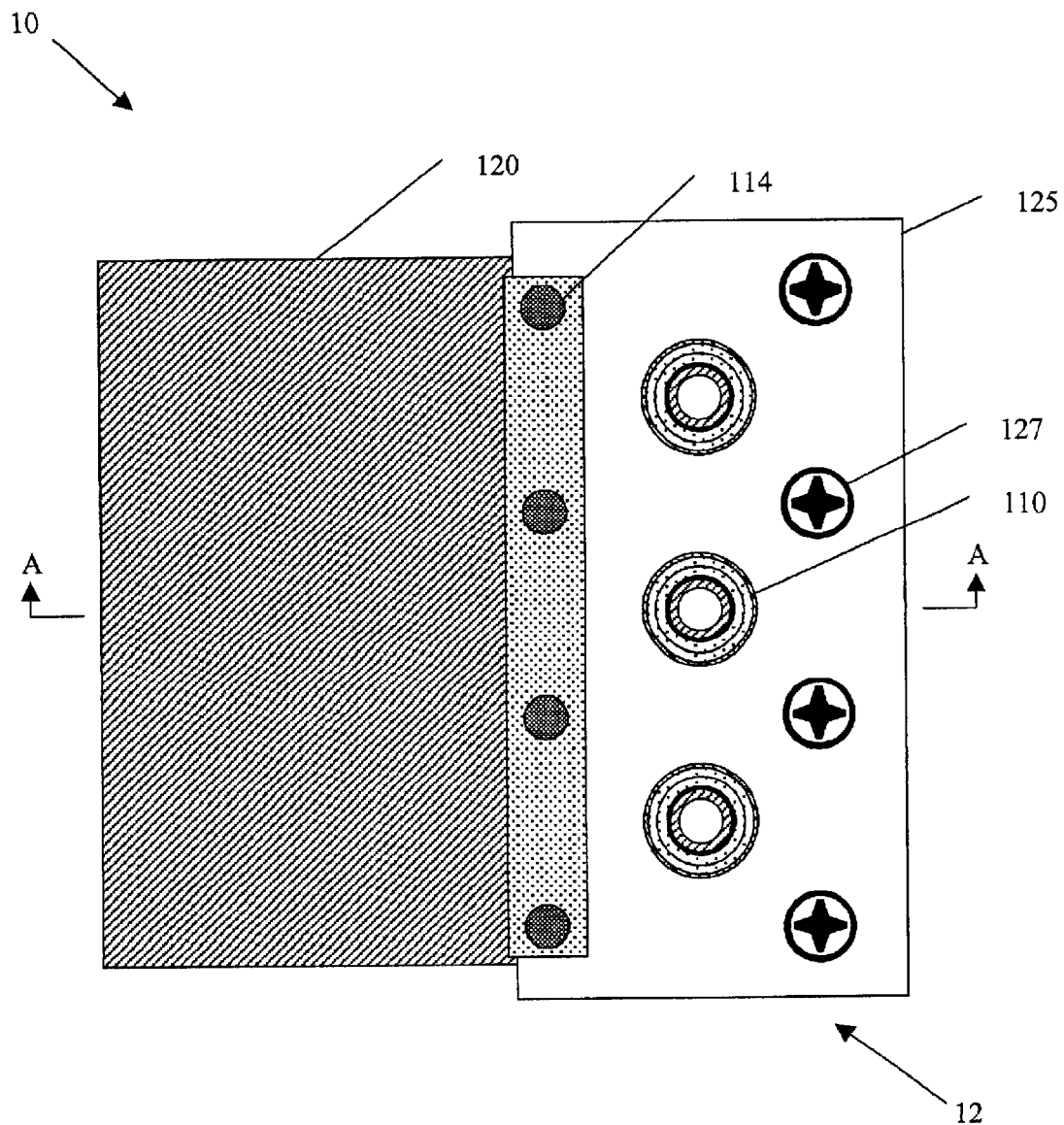
FIG. 2B is a diagram illustrating a plan section view of the embodiment in FIG. 2A.

FIGS. 2A and 2B are diagrams illustrating a power interconnect structure 10 similar to that described in FIGS. 1A and 1B but which utilize a single contiguous flexible circuit 123 having a first flexible circuit portion 123A and a second flexible circuit portion 124B enclosed in power interface assembly 12. In this embodiment, flexible circuits 123A and 123B may be two separate circuits that are joined in the area of coaxial interconnect 110 forming a single assembly. As shown, the second flexible circuit portion 123B wraps around internally in upper housing 125 and lower housing 126 and coming in contact with the lower pad 122 on the second circuit board 120. Electrical connectivity is made between a conductive surface on the flexible circuit 123B (such as the contact bumps described above with respect to FIGS. 1A and 1B) and the lower pad 122.

Bosses 128 which may be formed as a part of upper and lower housings 125 and 126 serve to hold in place flexible circuit ends 123A and 123B. This can be accomplished, for example, by using bosses 128 with surface features extending towards the flexible circuit 123, cooperatively interfacing with matching features such as holes extending vertically through flexible circuit 123. In addition, bosses 128 serve as limit stops when inserting power interface assembly 11 into second circuit board 120. Fasteners 127 secure the upper housing 125 to the lower housing 126.

Figure 3:
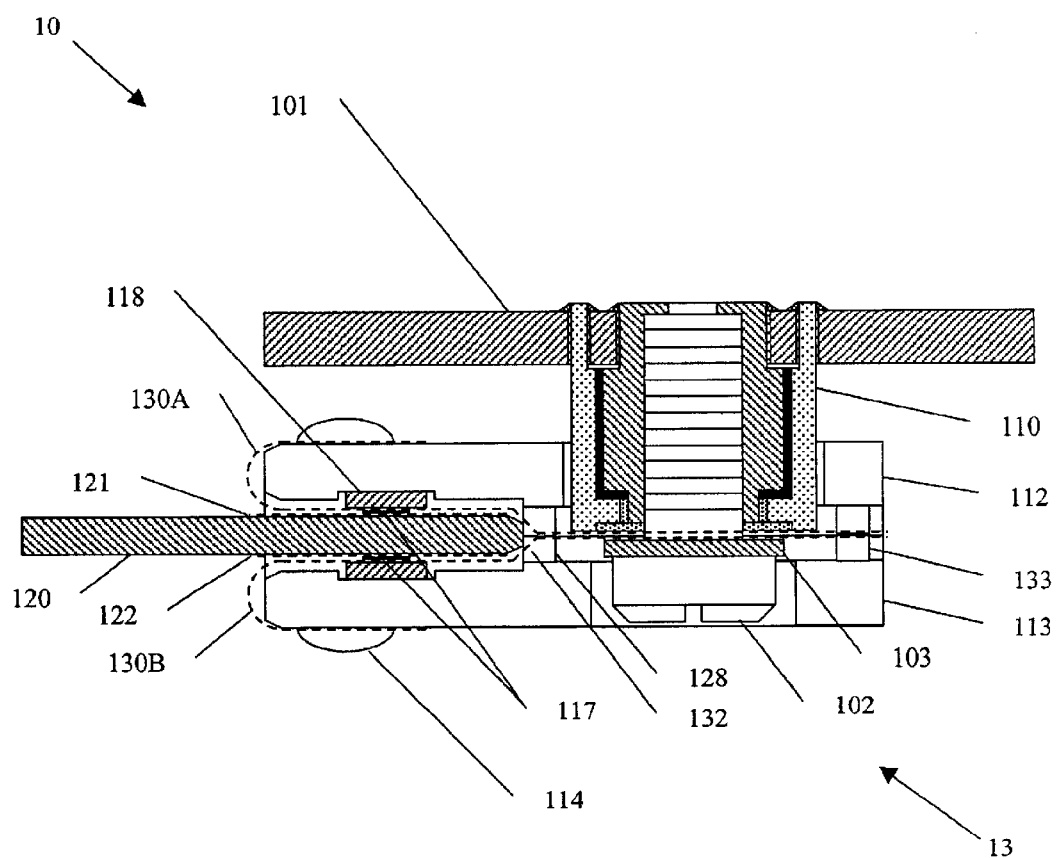
FIG. 3 illustrates a section view of the power interconnecting structure where the flexible circuits embrace the interposer board and are directly attached to coaxial interconnects that are permanently attached to a power regulator module.

FIG. 3 is a diagram illustrating a power interconnect structure 10 similar to that described in FIGS. 1A and 1B in which the power interface assembly 13 permits the coaxial interconnects 110 to be permanently attached to the first circuit board 101 in an inverted arrangement. Upper flexible circuit 130A and lower flexible circuit 130B come together in yoke area 132 and are in intimate surface contact with one another over the area where coaxial interconnect 110 interfaces to the two flexible circuits. Insulating material may be placed between the flexible circuits in this area to avoid the two power circuits from shorting one another, if necessary. Bosses 128 which can be a part of upper and lower housings 112 and 113 serve to hold in place flexible circuits 131 and 132, as described above with respect to FIGS. 2A and 2B. An advantage of this arrangement is the reduction in loop area between contact pads 117 and coaxial interconnect 110. A secondary advantage is the simplification of the flexible circuit structure eliminating the need for rigid board 111.

Figure 4A:
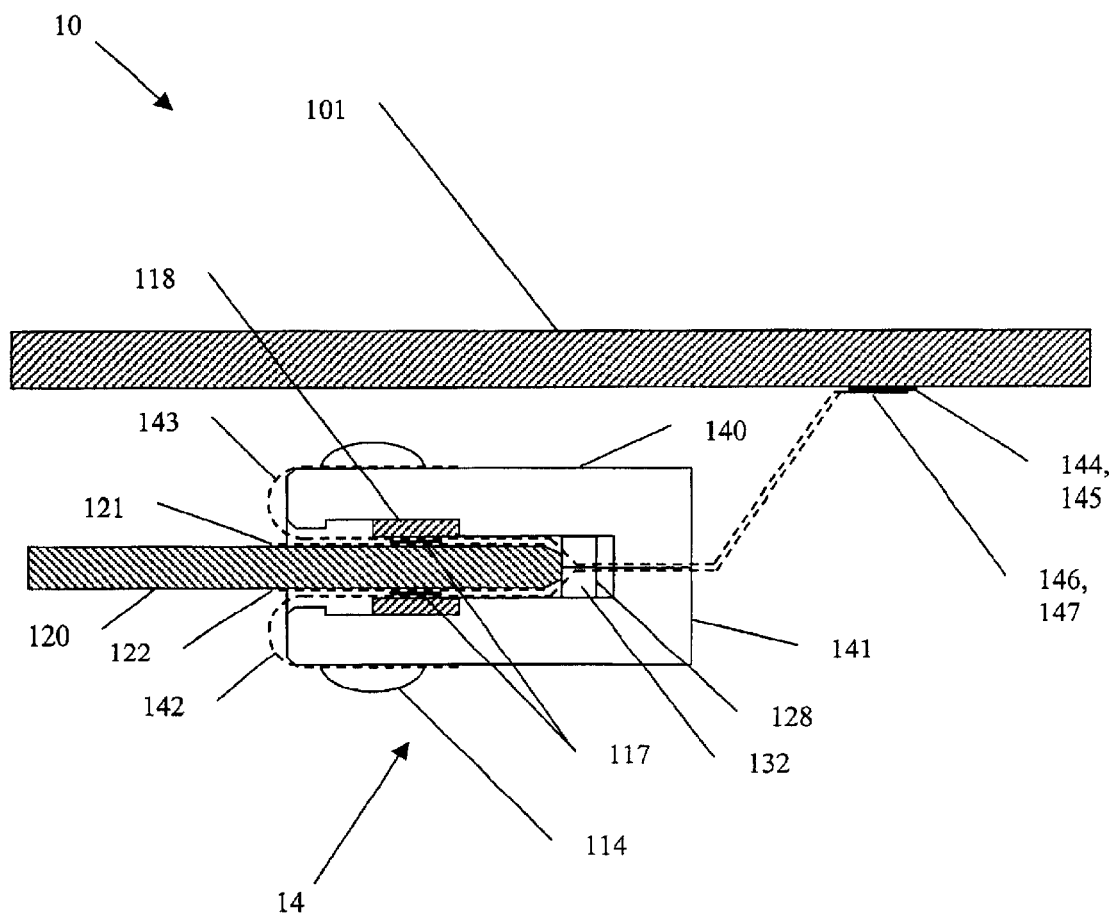
FIG. 4A is diagram illustrating a section view of the power interconnecting structure where the flexible circuit attaches directly to the power regulator module without use of a coaxial interconnect.
Figure 4B:
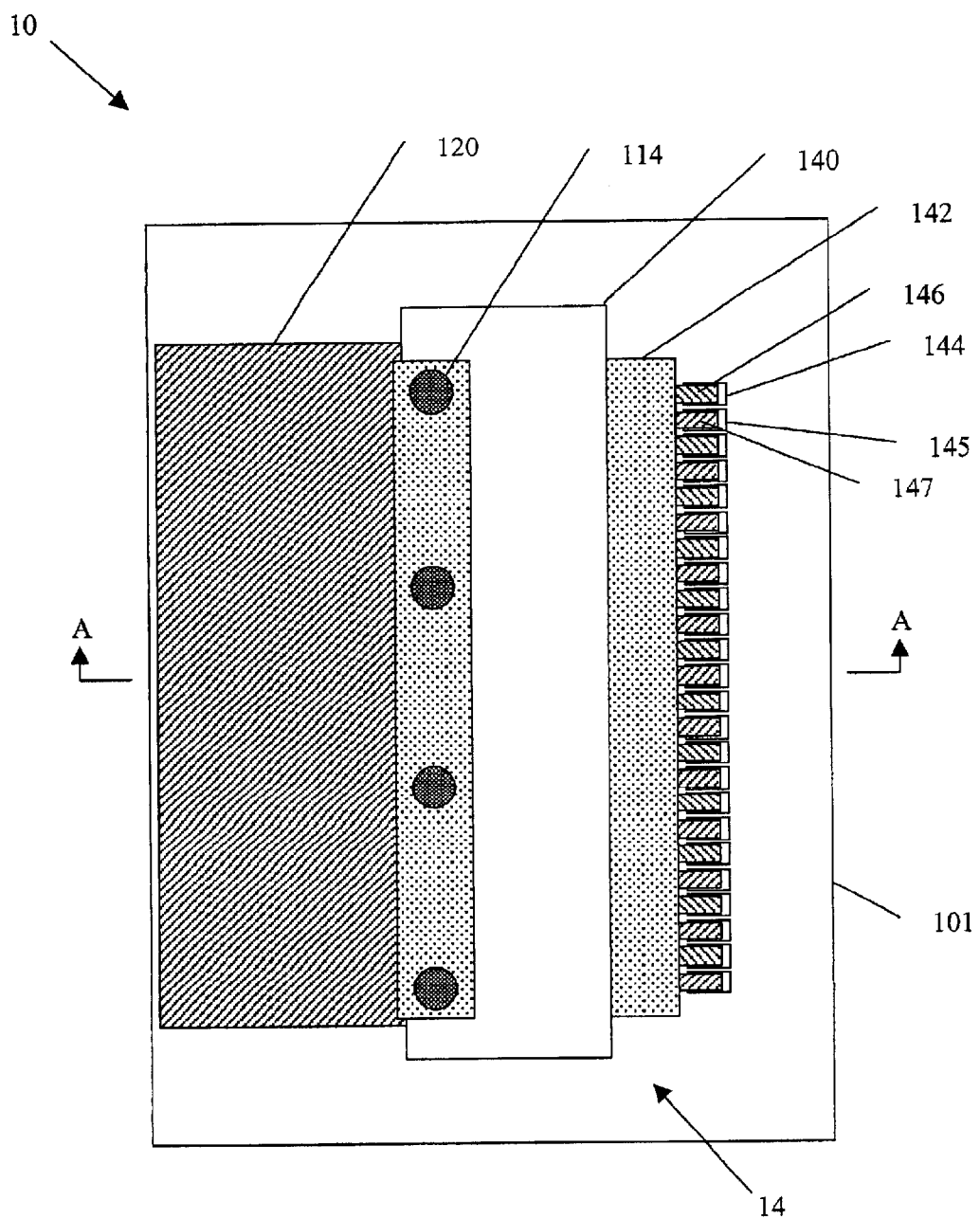
FIG. 4B is a diagram showing a plan view of the power interconnecting structure where the flexible circuit attaches directly to the power regulator module without use of a coaxial interconnect.

FIGS. 4A and 4B are diagrams illustrating a further embodiment of the power interconnect structure 10. Here, flexible circuits 142 and 143 are formed in a manner similar to that which was described with respect to FIG. 3, wherein a yoke area 132 is used to bring the upper flexible circuit 143 in contact with the lower flexible circuit 142. Unlike the embodiment in FIG. 3, however, after which the two flexible circuits 142, 143 are joined, they egress through a rear aperture formed by the upper housing 140 and lower housing 141. The upper 140 and lower 141 housings can either entrap the flexible circuits 142 and 143 using surface features or friction, or mold them in place forming one overall assembly 13.

After the flexible circuits 142 and 143 egress the housings 140 and 141 they are brought up to the first circuit board 101, which is a power regulator module, where the ends of each flexible circuit are interdigitated forming alternating soldered connection tabs 146 and 147 which are soldered to corresponding alternating power and ground surface pads 144 and 145 on the lower surface of the first circuit board 101. This arrangement provides a low inductance connection due to the small loop area between the interdigitated connections comprising of pads 144 and 145, and simplifies solder assembly, since a simple bar solder operation on one side of the flexible circuits can be used to solder all of the tabs of the flexible circuits to the pads on the first circuit board (power regulator module) 101.

Figure 5A:
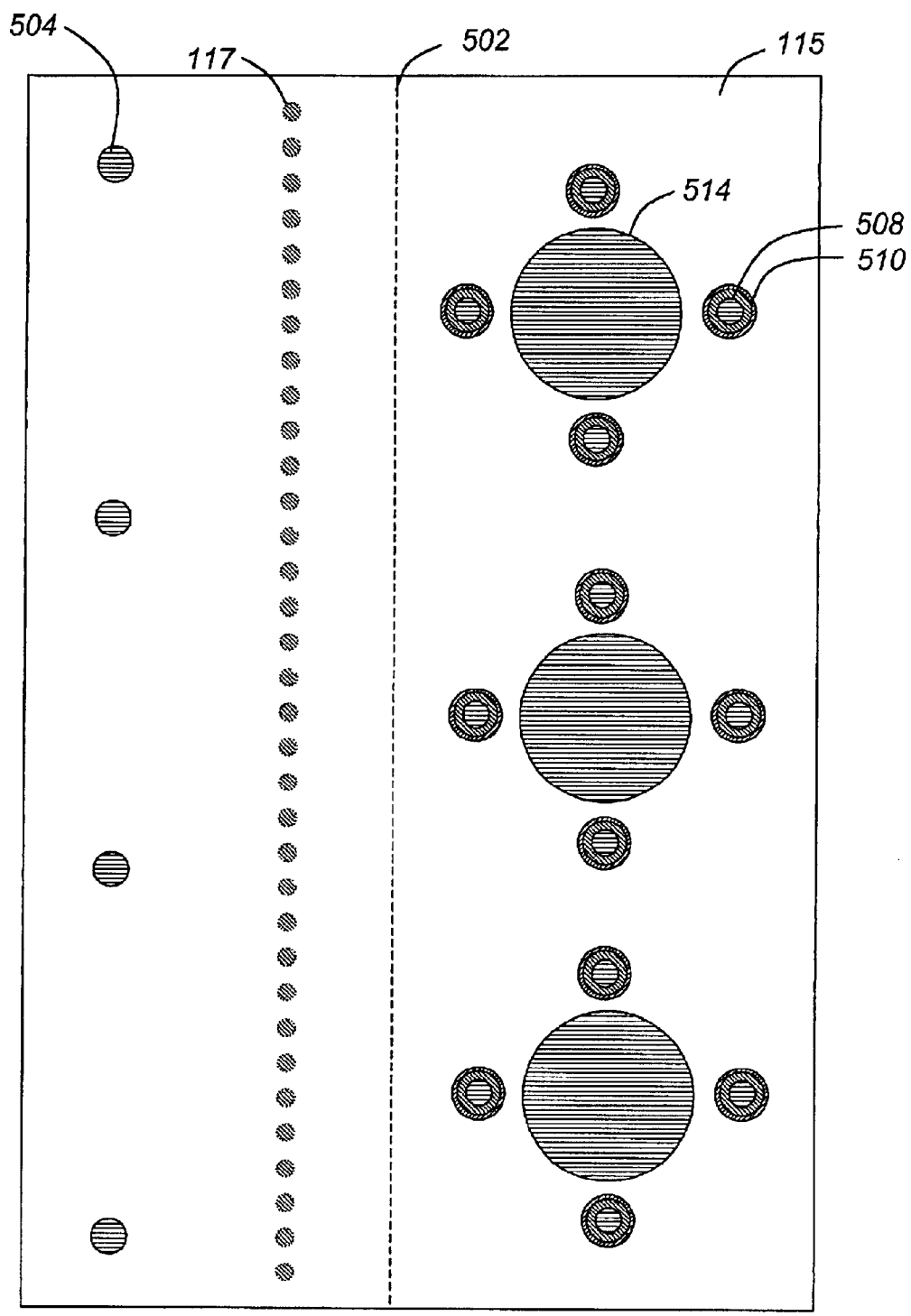
FIGS. 5A and 5B are diagrams showing further detail regarding the flexible circuits.
Figure 5B:
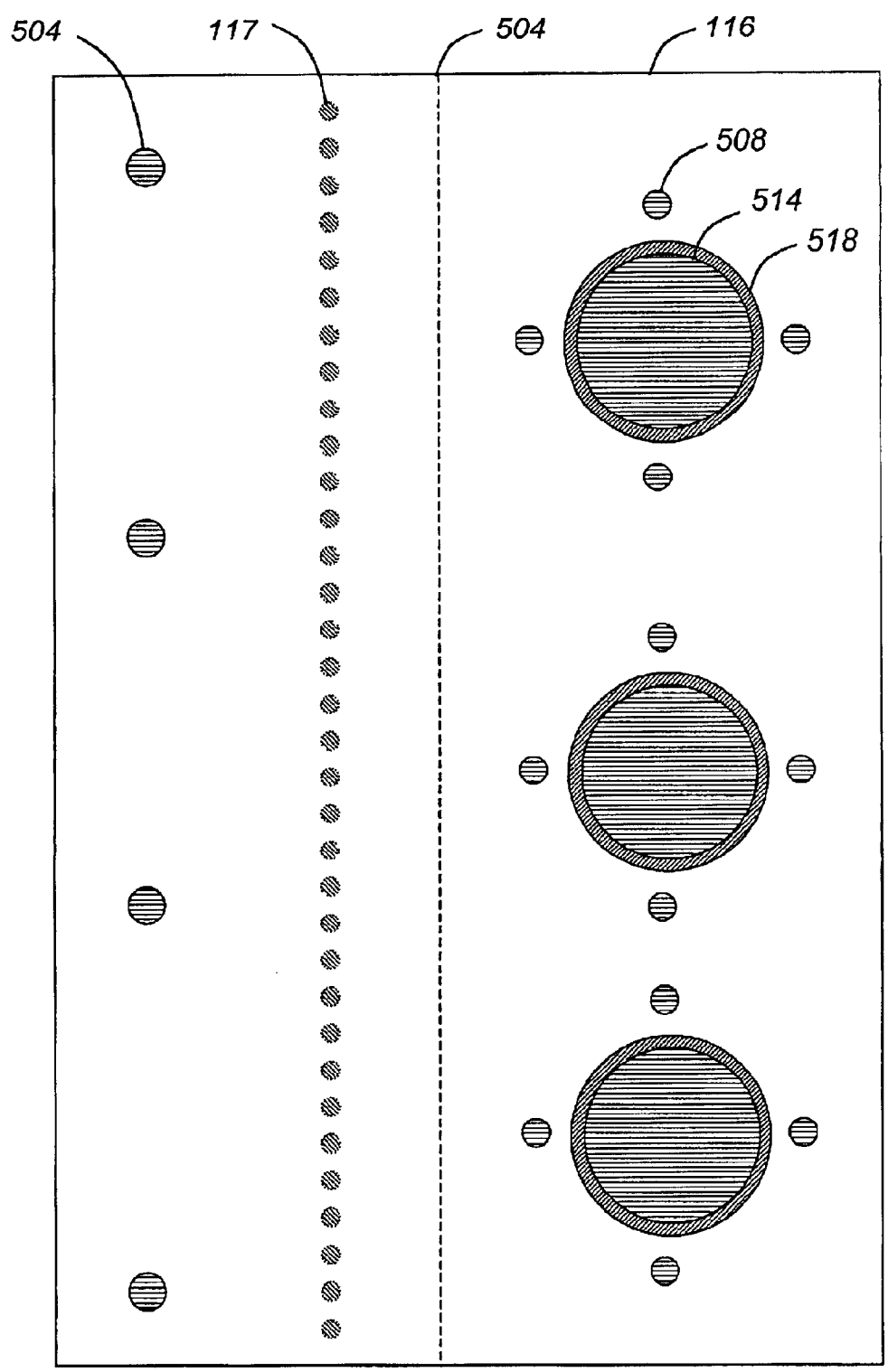

FIGS. 5A and 5B are diagrams showing further detail regarding the flexible circuits 115, 116. FIG. 5A is a diagram looking up from the bottom into first flexible circuit 115. The outline shown for flexible circuit 115 defines the perimeter of the copper foil of said flexible circuit pattern which forms the power interconnection. It will be understood that said flexible circuit further consists of additional insulating cover sheets in selected areas. Holes 504 are used for inserting attachments 114 through flexible circuit 115 thereby securing flexible circuit to housing 113. Plated through holes 508 terminate in isolated pad 510 which accommodates the solder connection of outer cylinder 110A to second flexible circuit 116. Hole 514 which may be either plated or unplated receives inner cylinder 110B and is soldered to foil surface of flexible circuit 115. Raised bump contacts 117 are shown as a dashed outline and are located on the far side of flexible circuit 115. Dashed line 502 locates the terminus of rigid board 111 to which flexible circuit 115 is laminated.

FIG. 5B is a diagram looking down from the top into second flexible circuit 116. Again, the outline shown for flexible circuit 116 defines the perimeter of the copper foil of said flexible circuit pattern which forms the ground interconnection. Hole 516, which receives the inner cylinder 110B, is isolated from the conductive foil of flexible circuit 116 by isolation area 518. Again, raised bump contacts 117 are shown as a dashed outline and are located on the far side of flexible circuit 116.

Those skilled in the art will recognize many modifications may be made to this configuration without departing from the scope of the present invention. For example, part of the power interconnecting structure could be used to provide signals as well as power, from the first circuit board (or an alternate circuit board) to the second circuit board.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An interconnecting structure for connecting a first circuit board and a second circuit board, comprising:
   a housing having a first portion and a second portion, said first portion and said second portion defining a cavity having an opening for accommodation of the second circuit board, and a second opening, opposite said cavity opening and in connection with said cavity;
   a first flexible circuit having a first plurality of connection contacts, said first flexible circuit extending through said second opening, along said cavity, and through said cavity opening and including a plurality of power connection tabs at a first end proximal to said second opening of said housing, wherein said plurality of power connection tabs are configured to connect to the power surface pads of the first circuit board; and
   a second flexible circuit having a second plurality of connection contacts, said second flexible circuit extending through said second opening and along said cavity, substantially parallel to said first flexible circuit, and through said cavity opening and including a plurality of ground connection tabs at a first end proximal to said second opening of said housing, wherein said plurality of ground connection tabs are configured to connect to the around surface pads of the first circuit board interdigitated with said power connection tabs on said first flexible circuit.

2. The interconnecting structure of claim 1, wherein said first plurality of connection contacts are configured to provide a power signal to the second circuit board and said second plurality of connection contacts are configured to provide a ground signal to the second circuit board.

3. The interconnecting structure of claim 1, further comprising a first compressible member disposed between said first housing portion and said first flexible circuit.

4. The interconnecting structure of claim 1, wherein said first portion and said second portion of said housing form a yolk proximal to said second opening such that said first flexible circuit and said second flexible circuit are in contact before entering said cavity.

5. The interconnecting structure of claim 1, wherein at least said first plurality of connection contacts comprise plurality of raised bump contacts.

6. An interconnector comprising:
   a first circuit board comprising a power conditioning circuit, and a plurality of power surface pads and a plurality of ground surface pads;
   a connector housing having a first portion and a second portion, said first portion and said second portion defining a cavity having an opening for accommodation of at least a portion of a circuit board having a processor, and a second opening, opposite said cavity opening and in connection with said cavity,
   a first flexible circuit having a plurality of power connection tabs coupled with said power surface pads on said first circuit board, said first flexible circuit extending from said connection with said power surface pads on said first circuit board through said second opening in said connector housing, along said cavity, and through said cavity opening; and
   a second flexible circuit having a plurality of ground connection tabs coupled with said ground surface pads on said first circuit board, said second flexible circuit extending from said connection with said ground surface pads on said first circuit board through said second opening in said connector housing and along said cavity, substantially parallel to said first flexible circuit, and through said cavity opening.

7. The structure of claim 6, wherein said power surface pads and said ground surface pads are arranged in alternating configuration.

8. The structure of claim 6, further comprising a first compressible member disposed between said first portion of said connector housing and said first flexible circuit in said cavity, and a second compressible member disposed between said second portion of said connector housing and said second flexible circuit in said cavity.

9. The interconnecting structure of claim 6, wherein said first portion and said second portion of said connector housing form a yolk proximal to said second opening such that said first flexible circuit and said second flexible circuit are in contact before entering said cavity.

10. The structure of claim 7, wherein said power connection tabs and said ground connection tabs are connected to said power surface pads and said ground surface pads in an interdigitated configuration.

11. A circuit board interconnection system, comprising:
a connector housing having a first portion and a second portion, said first portion and said second portion defining a cavity having an opening, and a second opening, opposite said cavity opening and in connection with said cavity;
a first circuit board comprising a power conditioning element, and a plurality of power surface pads and a plurality of ground surface pads;
a processor board having a processor mounted thereon, wherein at least a portion of said processor board is disposed in said cavity of said connector housing;
a first flexible circuit comprising a plurality of power connection tabs coupled with said power surface pads on said first circuit board, and a plurality of power connection contacts configured for connection to aid processor board, said first flexible circuit extending through said second opening in said connector housing, along said cavity between a first surface of said processor board and said first portion of said connector housing, and through said cavity opening; and
a second flexible circuit comprising a plurality of ground connection tabs coupled with said ground surface pads on said first circuit board, and a plurality of ground connection contacts configured for connection of said processor board, said second flexible circuit extending through said second opening in said connector housing and along said cavity between a second surface of said processor board and said second portion of said connector housing, and through said cavity opening.

12. The system of claim 11, wherein said power connection contacts comprise a first plurality of raised contact bumps, and said ground connection contacts comprise a second plurality of raised; contact bumps.

13. The system of claim 11, wherein said first flexible circuit is wrapped around an end of said first portion of said connector housing at said cavity opening, and said second flexible circuit is wrapped around an end of said second portion of said connector housing at said cavity opening.

14. The system of claim 11, further comprising a first compressible member disposed between said first flexible circuit and said first portion of said connector housing in said cavity, and a second compressible member disposed between said second flexible circuit and said second portion of said connector housing in said cavity.

15. The system of claim 11, wherein said first portion and said second portion of said connector housing form a yolk proximal to said second opening such that said first flexible circuit and said second flexible circuit are in contact before entering said cavity.

16. The system of claim 11, wherein said power surface pads and said ground surface pads are arranged in an alternating configuration.

17. The system of claim 16, wherein said power connection tabs and said ground connection tabs are connected to said power surface pads and said ground surface pads in an interdigitated configuration.

* * * * *